(12) United States Patent
Takeuchi et al.

(10) Patent No.: US 11,121,107 B2
(45) Date of Patent: Sep. 14, 2021

(54) INTERCONNECT SUBSTRATE HAVING COLUMNAR ELECTRODES

(71) Applicant: SHINKO ELECTRIC INDUSTRIES CO., LTD., Nagano (JP)

(72) Inventors: Akira Takeuchi, Nagano (JP); Hikaru Tanaka, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 16/364,740

(22) Filed: Mar. 26, 2019

(65) Prior Publication Data

US 2019/0304942 A1    Oct. 3, 2019

(30) Foreign Application Priority Data

Apr. 2, 2018 (JP) ................. JP2018-070751

(51) Int. Cl.
| | |
|---|---|
| *H01L 23/00* | (2006.01) |
| *H01L 23/522* | (2006.01) |
| *H01L 21/48* | (2006.01) |
| *H01L 21/768* | (2006.01) |

(52) U.S. Cl.
CPC .......... *H01L 24/17* (2013.01); *H01L 21/4853* (2013.01); *H01L 21/76877* (2013.01); *H01L 23/5226* (2013.01); *H01L 2224/1703* (2013.01); *H01L 2924/0105* (2013.01); *H01L 2924/01028* (2013.01); *H01L 2924/01029* (2013.01)

(58) Field of Classification Search
CPC .............. H01L 24/17; H01L 21/76877; H01L 2224/16238; H01L 2224/16227; H01L 2224/1403; H01L 2224/0603; H01L 23/49827

See application file for complete search history.

(56) References Cited

U.S. PATENT DOCUMENTS

| | | | |
|---|---|---|---|
| 2013/0221520 A1* | 8/2013 | Uno | H01L 21/76841 257/737 |
| 2013/0292827 A1* | 11/2013 | Kuo | H01L 23/49816 257/737 |
| 2017/0250153 A1* | 8/2017 | Kikuchi | H01L 24/13 |
| 2019/0246496 A1* | 8/2019 | Wu | H01L 24/11 |

FOREIGN PATENT DOCUMENTS

| | | |
|---|---|---|
| JP | 2007-103878 | 4/2007 |
| JP | 2017-152646 | 8/2017 |

* cited by examiner

*Primary Examiner* — Jay C Chang
*Assistant Examiner* — Mikka Liu
(74) *Attorney, Agent, or Firm* — IPUSA, PLLC

(57) ABSTRACT

An interconnect substrate includes a substrate, and a first connection terminal and a second connection terminal that are disposed on a surface of the substrate, wherein the first connection terminal includes a first columnar electrode and a first bump disposed on the first columnar electrode, the first columnar electrode having a flat or convex surface and having a first diameter, wherein the second connection terminal includes a second columnar electrode and a second bump disposed on the second columnar electrode, the second columnar electrode having a concave surface and having a second diameter larger than the first diameter, and wherein a melting point of the first bump and the second bump is lower than a melting point of the first columnar electrode and the second columnar electrode.

9 Claims, 10 Drawing Sheets

INTERCONNECT SUBSTRATE HAVING COLUMNAR ELECTRODES

CROSS-REFERENCE TO RELATED APPLICATIONS

The present application is based on and claims priority to the Japanese Patent Application No. 2018-070751 filed on Apr. 2, 2018, with the Japanese Patent Office, the entire contents of which are incorporated herein by reference.

FIELD

The disclosures herein relate to an interconnect substrate, a semiconductor package, and a method of making an interconnect substrate.

BACKGROUND

With increases in the numbers of connection terminals of semiconductor chips in recent years, semiconductor chips having a plurality of connection terminals with different diameters have been put into use. In order to cope with such semiconductor chips, an interconnect substrate for use in a semiconductor package for containing a semiconductor chip is also required to have a plurality of connection terminals with different diameters. Connection terminals on an interconnect substrate typically include copper (Cu) posts and bumps placed thereon.

A semiconductor package having connection terminals with different diameters may suffer connection failures between the interconnect substrate and the semiconductor chip. For example, with two connection terminals having large diameters (which may hereinafter be referred to as "large-diameter terminals"), short-circuiting may occur between the bumps of these two large-diameter terminals. Further, with connection terminals having small diameters (which may hereinafter be referred to as "small-diameter terminals"), connection failures may occur in which the connection terminals fail to come in contact with the connection terminals of a semiconductor chip. Such short-circuiting and connection failures reduce the reliability of connections in semiconductor packages that have connection terminals of differing diameters.

Accordingly, there may be a need for an interconnect substrate, a semiconductor package, and a method of making an interconnect substrate for which the reliability of connections is improved.

RELATED-ART DOCUMENTS

Patent Document

[Patent Document 1]Japanese Patent Application Publication No. 2007-103878
[Patent Document 2]Japanese Patent Application Publication No. 2017-152646

SUMMARY

According to an aspect of the embodiment, an interconnect substrate includes a substrate, and a first connection terminal and a second connection terminal that are disposed on a surface of the substrate, wherein the first connection terminal includes a first columnar electrode and a first bump disposed on the first columnar electrode, the first columnar electrode having a flat or convex surface and having a first diameter, wherein the second connection terminal includes a second columnar electrode and a second bump disposed on the second columnar electrode, the second columnar electrode having a concave surface and having a second diameter larger than the first diameter, and wherein a melting point of the first bump and the second bump is lower than a melting point of the first columnar electrode and the second columnar electrode.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

The inventors of the present application have analyzed the causes of short-circuiting and connection failures occurring in related-art semiconductor packages. Diligent analysis by the inventors has revealed that small-diameter terminals end up being shorter than large-diameter terminals despite the fact that the height of posts is set equal between the small-diameter terminals and the large-diameter terminals. In the following, this newly-obtained insight will be described.

Figure 1A:
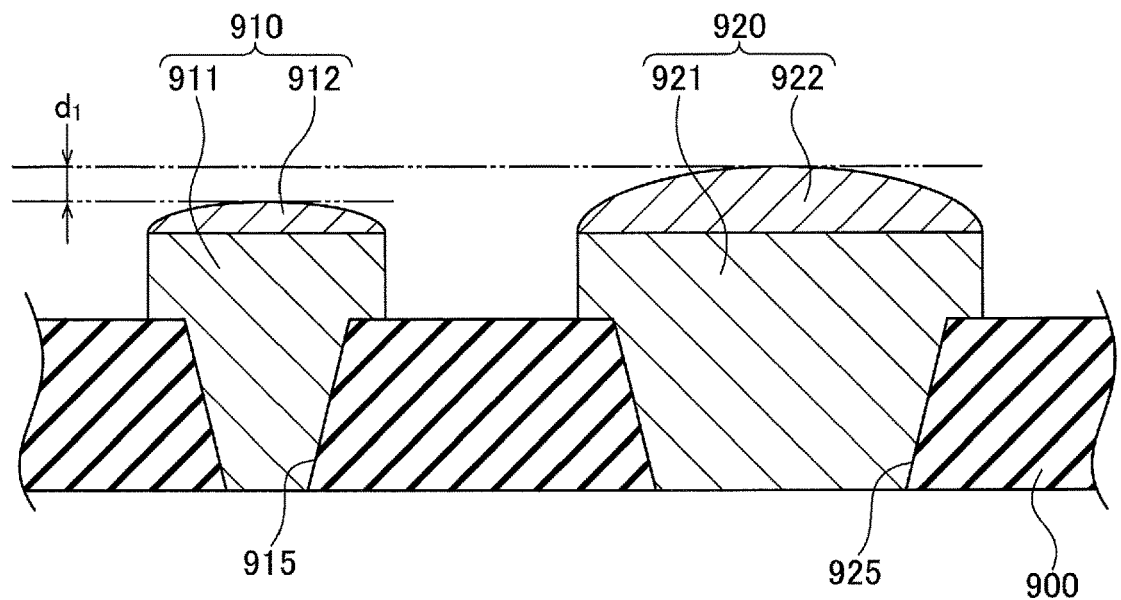
FIGS. 1A and 1B are cross-sectional views illustrating examples of connection terminals included in a semiconductor package.
Figure 1B:
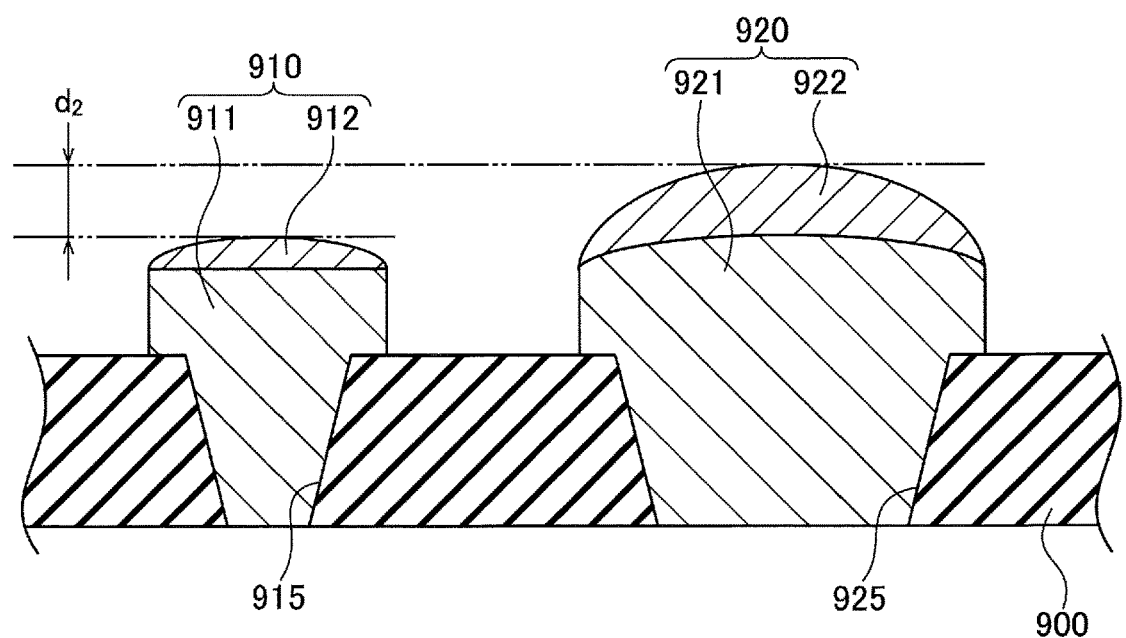

FIGS. 1A and 1B are cross-sectional views illustrating examples of connection terminals included in a semiconductor package. In the examples illustrated in FIGS. 1A and 1B, a via-hole 915 for a small-diameter terminal and a via-hole 925 for a large-diameter terminal are formed in a solder-resist layer 900. The diameter of the via-hole 925 is larger than the diameter of the via-hole 915. A post 911 is formed inside the via-hole 915, and a post 921 having a larger diameter than the post 911 is formed inside the via-hole 925. Moreover, a bump 912 is formed on the post 911, and a bump 922 is formed on the post 921. A small-diameter terminal 910 includes the post 911 and the bump 912. A large-diameter terminal 920 includes the post 921 and the bump 922. The posts 911 and 921 may be formed through copper electroplating. The bumps 912 and 922 may be formed through tin electroplating. After forming the posts and the bumps, a reflow process is performed with respect to the bump 912 and the bump 922 to form the small-diameter terminal 910 and the large-diameter terminal 920.

In the example illustrated in FIG. 1A, the surfaces of the posts 911 and 921 are flat and aligned at the same height. With the height of the flat-surface posts 911 and 921 being aligned, a reflow process creates the bump 922 that is thicker at the center than the thickness of the bump 912. The large-diameter terminal 920 thus ends up being taller than the small-diameter terminal 910.

In some circumstances, the surface of the post 921 may have a convex form while the surface of the post 911 is flat, as illustrated in FIG. 1B. In this case also, a reflow process creates the bump 922 that is thicker at the center than the thickness of the bump 912, which results in the large-diameter terminal 920 being taller than the small-diameter terminal 910.

A height difference $d_2$ between the top portions in the example illustrated in FIG. 1B is greater than a height difference $d_1$ between the top portions in the example illustrated in FIG. 1A, which makes the height difference between the large-diameter terminal 920 and the small-diameter terminal 910 more prominent.

Placing a semiconductor chip in a flip-chip manner on an interconnect substrate having a height difference between the small-diameter terminal 910 and the large-diameter terminal 920 may result in the small-diameter terminal 910 failing to come in contact with a connection terminal of the semiconductor chip while the large-diameter terminal 920 comes in contact with a connection terminal of the semiconductor chip. A connection failure thus occurs. Moreover, some portion of the bump 922 of the large-diameter terminal 920 may become excessive and spill on to the surrounding areas at the time of a reflow process, which may cause short-circuiting between the bumps 922.

Although not illustrated in FIGS. 1A and 1B, the surface of the small-diameter terminal 910 may become convex in addition to the surface of the large-diameter terminal 920. Even in this case, the large-diameter terminal 920 is still higher than the small-diameter terminal 910, which creates a risk of connection failure and short-circuit.

Figure 2:
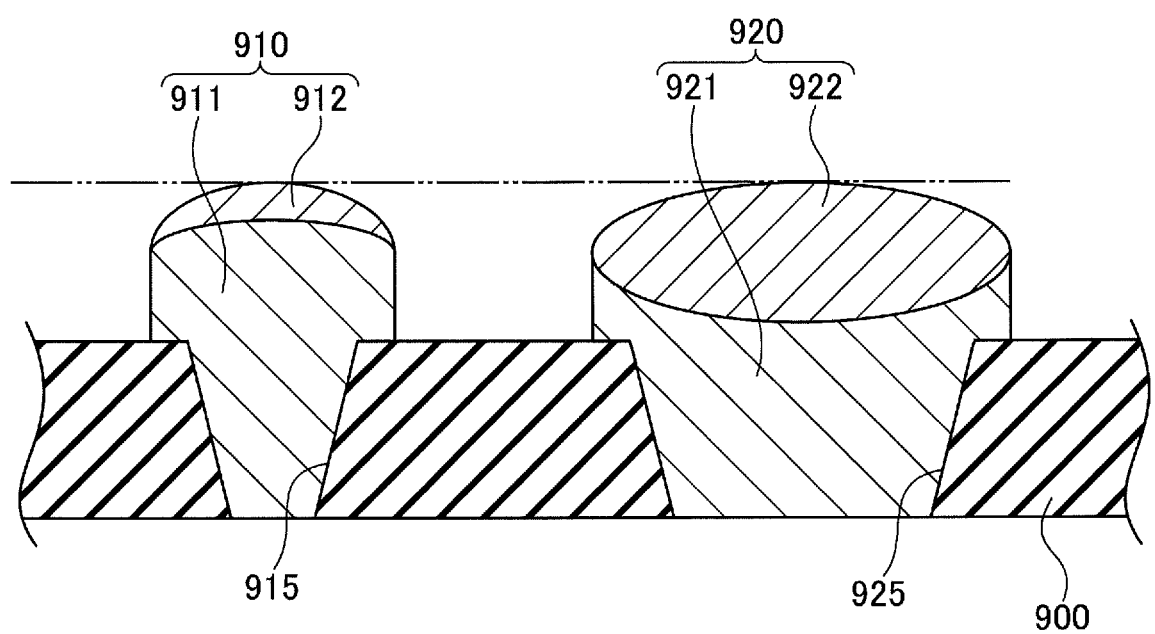
FIG. 2 is a cross-sectional view illustrating another example of connection terminals included in a semiconductor package.

Previously, the occurrence of the above-noted phenomenon was not known, and, thus, no measures have been taken. According to further detailed studies conducted by the inventors of the present invention with regard to this phenomenon, the provision of a concave surface for the post 921 of the large-diameter terminal 920 as illustrated in FIG. 2 causes the height of the small-diameter terminal 910 and the large-diameter terminal 920 to be substantially aligned after the reflow process. This arrangement reduces the occurrence of connection failures and short circuiting, thereby improving the reliability of connections.

The inventors have made the following embodiments based on these newly-obtained insights. In the following, the embodiments will be described with reference to the accompanying drawings. In the specification and drawings, elements having substantially the same functions or configurations are referred to by the same numerals, and a duplicate description thereof may be omitted.

First Embodiment

A first embodiment will be described. The first embodiment is directed to an interconnect substrate.

[Structure of Interconnect Substrate]

Figure 3:
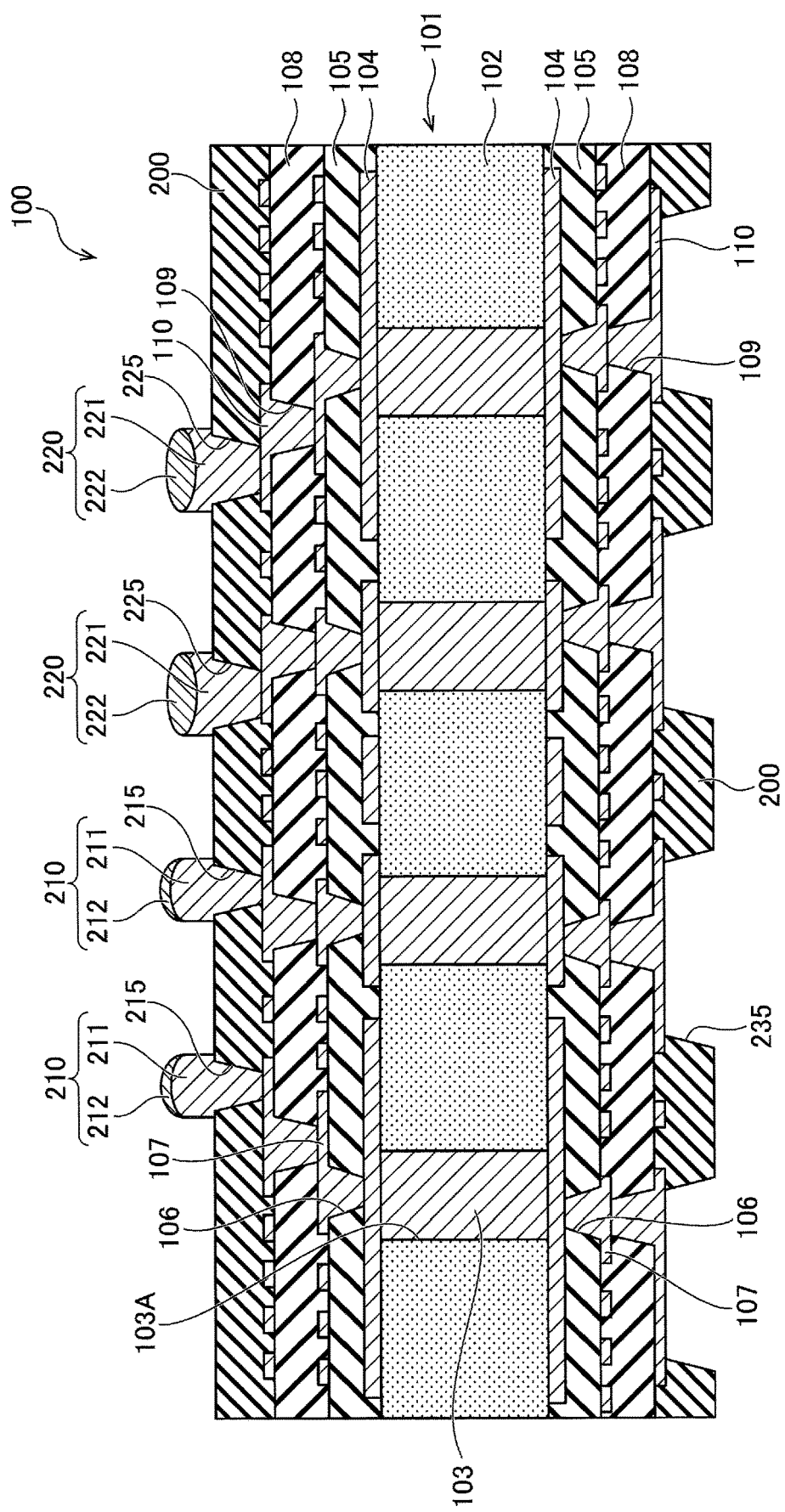
FIG. 3 is a cross-sectional view illustrating the structure of an interconnect substrate according to a first embodiment.

In the following, the structure of an interconnect substrate will be described first. FIG. 3 is a cross-sectional view illustrating the structure of an interconnect substrate according to the first embodiment.

As illustrated in FIG. 3, an interconnect substrate 100 of the first embodiment includes a core interconnect substrate 101 serving as a support member. The core interconnect substrate 101 includes a core substrate 102 made of an insulating material, such as a glass epoxy resin or a bismaleimide triazine resin. First interconnect layers 104 made of copper or the like are formed on the respective surfaces of the core substrate 102. The core substrate 102 has through-holes 103A penetrating therethrough in the thickness direction. The through-holes 103A have penetrating conductors 103 therein. The first interconnect layers 104 on the respective surfaces of the core substrate 102 are coupled to each other through the penetrating conductors 103. Alternatively, a through-hole plating layer may be formed on the sidewalls of the through-holes 103A, with the remaining space of the through-holes 103A being filled with a resin member. In this case, the first interconnect layers 104 on the respective surfaces of the core substrate 102 are coupled to each other through the through-hole plating layer.

First insulating layers 105 are formed over and under the core substrate 102. The first insulating layers 105 have via holes 106 in contact with the first interconnect layers 104. Second interconnect layers 107 are disposed on the first insulating layers 105 to be coupled to the first interconnect layers 104 through via conductors inside the via holes 106. Further, second insulating layers 108 are disposed on the first insulating layers 105 over and under the core substrate 102. The second insulating layers 108 have via holes 109 in contact with the second interconnect layers 107. Third interconnect layers 110 are disposed on the second insulating layers 108 to be coupled to the second interconnect layers 107 through via conductors inside the via holes 109.

Solder resist layers 200 are disposed on the second insulating layers 108 over and under the core substrate 102. The solder resist layer 200 disposed over the core substrate 102 at the position to be connected to a semiconductor chip has first via-holes 215 and second via-holes 225 that extend to, and are in contact with, the upper third interconnect layer 110. The diameter of the second via-holes 225 is larger than the diameter of the first via-holes 215. The depth of the first via-holes 215 and the second via-holes 225 is 15 to 25 micrometers, for example. Each of the first via-holes 215 is 10 to 15 micrometers in diameter at the bottom, and is 22 to 27 micrometers in diameter at the top. Each of the second via-holes 225 is 40 to 50 micrometers in diameter at the bottom, and is 55 to 60 micrometers in diameter at the top. The solder resist layer 200 disposed under the core substrate 102 has openings 235 that extend to, and are in contact with, the lower third interconnect layer 110.

At the position to be connected to the semiconductor chip over the core substrate 102, first connection terminals 210 are disposed on the upper third interconnect layer 110 to extend through the first via-holes 215 and protrude upwardly from the upper solder resist layer 200, and second connection terminals 220 are disposed on the upper third interconnect layer 110 to extend through the second via-holes 225 and protrude upwardly from the upper solder resist layer 200. The first connection terminals 210 include first posts 211 and first bumps 212. The second connection terminals 220 include second posts 221 and second bumps 222. The surfaces of the first posts 211 are curved and convex, and the surfaces of the second posts 221 are curved and concave. The peak height of the first connection terminals 210 and the peak height of the second connection terminals 220 as measured from the surface of the upper solder resist layer 200 are 15 to 25 micrometers, for example, and are equal to each other. The first posts 211 are an example of a first columnar electrode, and the second posts 221 are an example of a second columnar electrode.

The melting point of the first bumps 212 and the second bumps 222 is lower than the melting point of the first posts 211 and the second posts 221. The first posts 211 and the second posts 221 contain copper (Cu) or nickel (Ni), or both, for example. The first bumps 212 and the second bumps 222 contain tin (Sn) or solder, for example. The first posts 211 and the second posts 221 may have a copper plating layer made by electroplating and a nickel plating layer disposed thereon, for example. Solder may be a lead-free solder such as a tin-silver-based (Sn, Ag-based) alloy, a tin-zinc-based (Sn, Zn-based) alloy, or a tin-copper-based (Sn, Cu-based) alloy, or may be a leaded solder such as a lead-tin-based (Pb, Sn-based) alloy, for example.

In the present embodiment as described above, the surface of the first posts 211 is convex while the surface of the second posts 221 is concave, so that the height of the first connection terminals 210 and the height of the second connection terminals 220 as measured at the top points thereof are equal to each other. At the time of mounting a semiconductor chip in a flip-chip manner, thus, the small-diameter, first connection terminals 210 are electrically coupled to the connection terminals of the semiconductor chip without failure, while the large-diameter, second connection terminals 220 are free from the spilling of the second bumps 222. In this manner, the present embodiment is able to improve the reliability of connections.

It may be noted that the height of the first connection terminals 210 and the height of the second connection terminals 220 do not have to be perfectly the same, Further, the same advantage is obtained even when the surface of the first posts 211 is flat.

If the surface of small-diameter posts were concave and the surface of large-diameter posts were flat or concave, a protrusion of the bumps on the small-diameter posts would be reduced while a protrusion of the bumps on the large-diameter posts would become relatively large. Consequently, the small-diameter connection terminals having the small-diameter posts would become significantly shorter than the large-diameter connection terminals having the large-diameter posts, which results in an increase in the height difference. Upon mounting a semiconductor chip on such an interconnect substrate, the occurrence of connection failure and short-circuit would be more likely, thereby undermining the reliability of the semiconductor package.

There is no need for the pitch of the first connection terminals 210 and the pitch of the second connection terminals 220 to be even. The pitch of the first connection terminals 210 may be shorter than the pitch of the second connection terminals 220, for example.

[Method of Making Interconnect Substrate]

In the following, a method of making the interconnect substrate will be described. FIGS. 4A and 4B through FIGS. 6A and 6B are cross-sectional views illustrating a method of making the interconnect substrate according to the first embodiment.

Figure 4A:
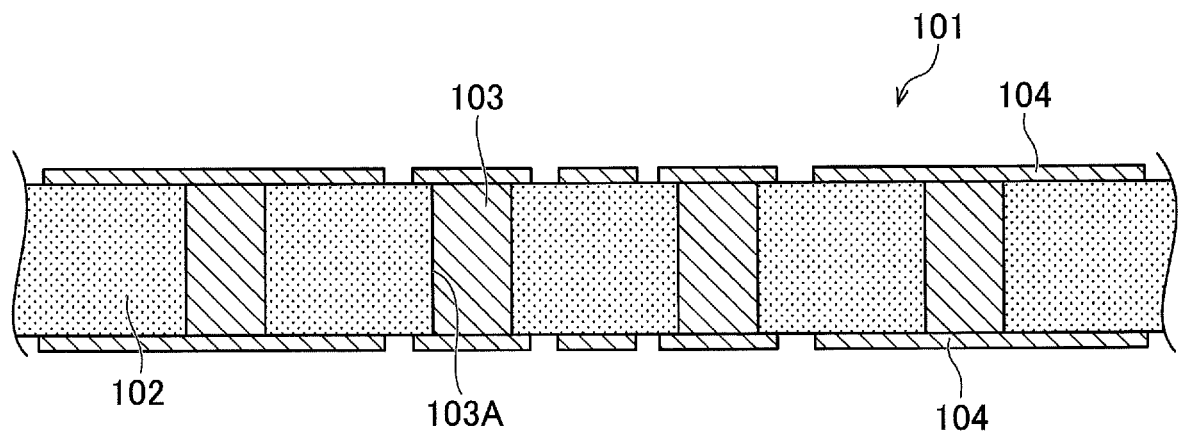
FIGS. 4A and 4B are cross-sectional views illustrating a method of making the interconnect substrate according to the first embodiment.

As illustrated in FIG. 4A, the core interconnect substrate 101 is provided as a supporting member. The core interconnect substrate 101 includes the core substrate 102 and the first interconnect layers 104. The core substrate 102 has the through-holes 103A penetrating therethrough in the thickness direction. The through-holes 103A have the penetrating conductors 103 therein. The through-holes 103A may be formed by a process using a drill or a laser beam, for example. The penetrating conductors 103 and the first interconnect layers 104 may be formed by plating and photolithography or the like, for example. The core interconnect substrate 101 is a large-size substrate from which a plurality of interconnect substrates 100 may be produced. Namely, the core interconnect substrate 101 includes a plurality of areas, in each of which a structure corresponding to the interconnect substrate 100 is formed.

Figure 4B:
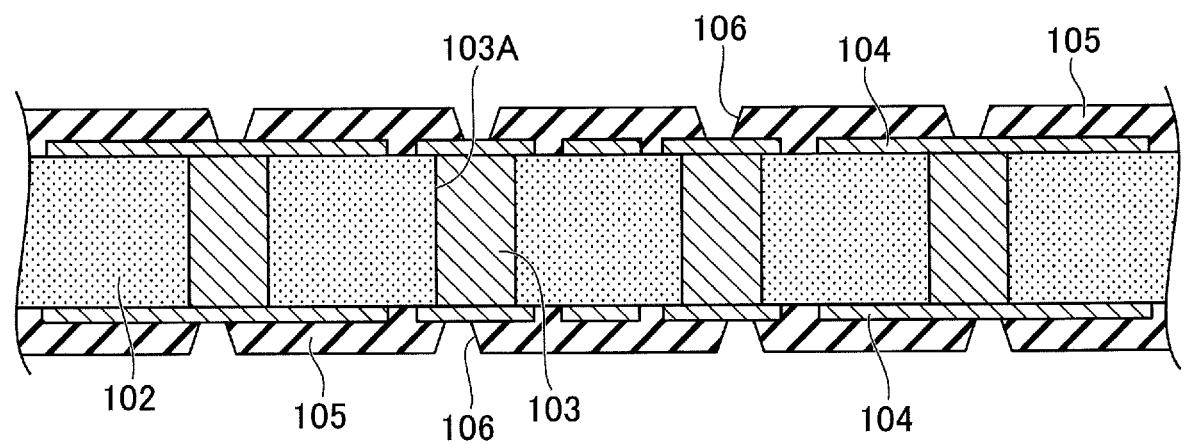

As illustrated in FIG. 4B, uncured resin films, which are attached to the respective surfaces of the core substrate 102, are heated and cured to form the first insulating layers 105. The first insulating layers 105 may be made of an insulating resin such as an epoxy resin or a polyimide resin. Alternatively, a liquid resin may be applied to form the first insulating layers 105. Subsequently, the first insulating layers 105 on the respective surfaces of the core substrate 102 are processed by a laser, which produces, through the first insulating layers 105, the via holes 106 that extend to, and are in contact with, the respective first interconnect layers 104.

Figure 5A:
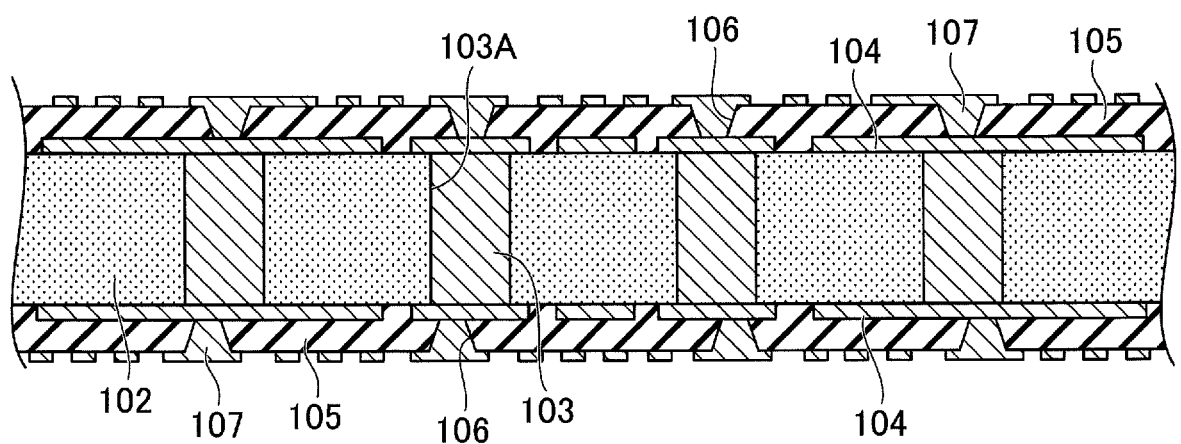
FIGS. 5A and 5B are cross-sectional views illustrating the method of making the interconnect substrate according to the first embodiment.

As illustrated in FIG. 5A, the second interconnect layers 107 are formed on the respective first insulating layers 105 over and under the core substrate 102, and are connected to the respective first interconnect layers 104 through the via conductors inside the via holes 106.

The second interconnect layers 107 may be formed by a semi-additive process. The method of forming the second interconnect layers 107 will be described in detail. A seed layer (not shown) made of copper or the like is formed on each of the first insulating layers 105 and inside the via holes 106 by electroless plating or sputtering. A resist layer (not shown) for plating is formed that has openings at the positions where the second interconnect layers 107 are to be formed. Electroplating that utilizes the seed layer as a plating-power feeding path is performed to form a metal plating layer made of copper or the like in the openings of the resist layer. Subsequently, the resist layer is removed. The seed layer is then removed by wet etching, which utilizes the metal plating layer as a mask. In this manner, the second interconnect layers 107, each of which includes the seed layer and the metal plating layer, are formed.

Figure 5B:
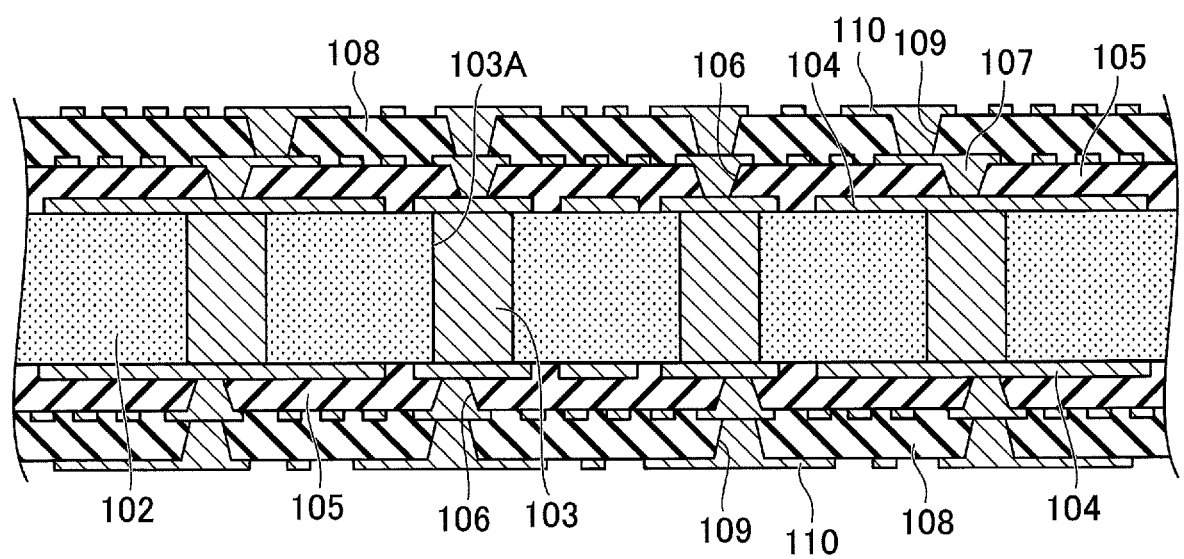

After the formation of the second interconnect layers 107, the second insulating layers 108, which have the via holes 109 at the contact points of the second interconnect layers 107, are formed on the respective first insulating layers 105 as illustrated in FIG. 5B. The second insulating layers 108 may be formed similarly to the manner in which the first insulating layers 105 are formed.

As illustrated in FIG. 5B, the third interconnect layers 110 are formed on the respective second insulating layers 108 over and under the core substrate 102, and are connected to the respective second interconnect layers 107 through the via conductors inside the via holes 109. The third interconnect layers 110 may be formed similarly to the manner in which the second interconnect layers 107 are formed.

Figure 6A:
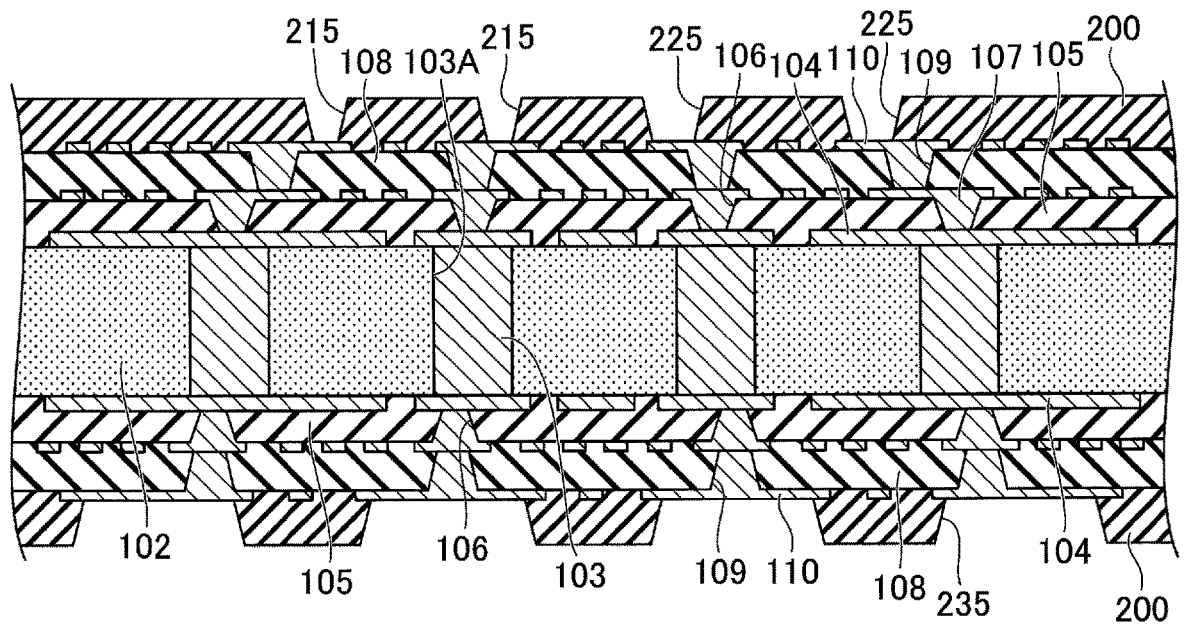
FIGS. 6A and 6B are cross-sectional views illustrating the method of making the interconnect substrate according to the first embodiment.

As illustrated in FIG. 6A, the solder resist layers 200 are formed on the respective second insulating layers 108 over and under the core substrate 102. Thereafter, the first via-holes 215 and the second via-holes 225 that extend to, and are in contact with, the upper third interconnect layer 110 are formed through the solder resist layer 200 disposed over the core substrate 102 at the position to be connected to a semiconductor chip. The diameter of the second via-holes 225 is made larger than the diameter of the first via-holes 215. Further, the openings 235 that extend to, and are in contact with, the lower third interconnect layer 110 are formed through the solder resist layer 200 disposed under the core substrate 102.

The solder resist layers 200 may be made of an insulating resin such as a photosensitive epoxy resin or acrylic resin. The solder resist layers 200 may be formed by attaching resin films or applying a liquid resin. The first via-holes 215, the second via-holes 225, and the openings 235 may be formed by exposure to light and development. An insulating resin such as a non-photosensitive epoxy resin or polyimide resin may be used as the solder resist layers 200. In this case, the first via-holes 215, the second via-holes 225, and the openings 235 may be formed by a laser process or by blasting.

Figure 6B:
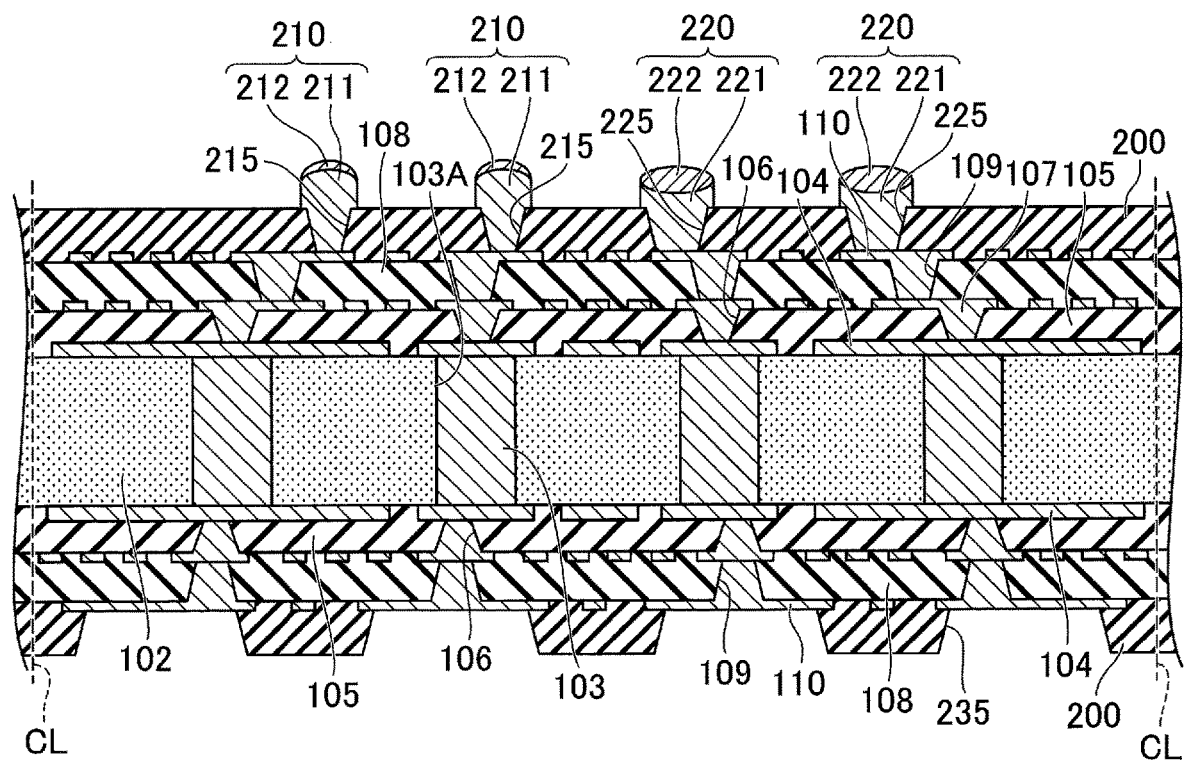

As illustrated in FIG. 6B, at the position to be connected to the semiconductor chip over the core substrate 102, the first connection terminals 210 are formed on the contact points of the upper third interconnect layer 110 to extend through the first via-holes 215 and protrude upwardly from the upper solder resist layer 200, and the second connection terminals 220 are formed on the contact points of the upper third interconnect layer 110 to extend through the second via-holes 225 and protrude upwardly from the upper solder resist layer 200. The first connection terminals 210 include the first posts 211 and the first bumps 212. The second connection terminals 220 include the second posts 221 and the second bumps 222.

The structure illustrated in FIG. 6B is then cut along the cut lines CL by a slicer or the like. As a result, structures each corresponding to an interconnect substrate 100 are obtained as separate pieces. Namely, a plurality of interconnect substrates 100 according to the first embodiment are obtained from the large-size core interconnect substrate 101. In this manner, the interconnect substrate 100 of the first embodiment illustrated in FIG. 3 is completed in final form.

In the following, a method of forming the first connection terminals 210 and the second connection terminals 220 will be described in detail. FIGS. 7A through 7C and FIGS. 9A and 9B are cross-sectional views illustrating the method of forming the first connection terminals 210 and the second connection terminals 220.

Figure 7A:
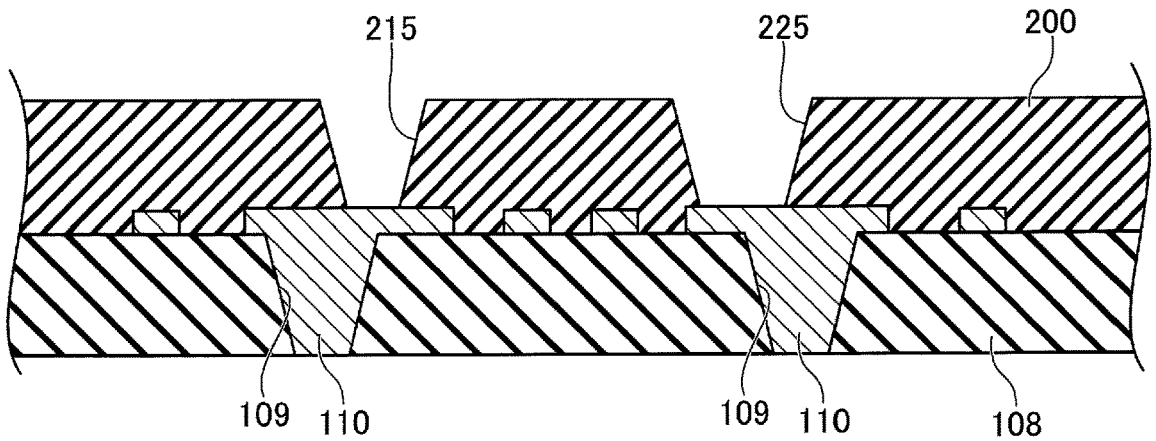
FIGS. 7A through 7C are cross-sectional views illustrating a method of forming connection terminals used in the first embodiment.
Figure 7B:
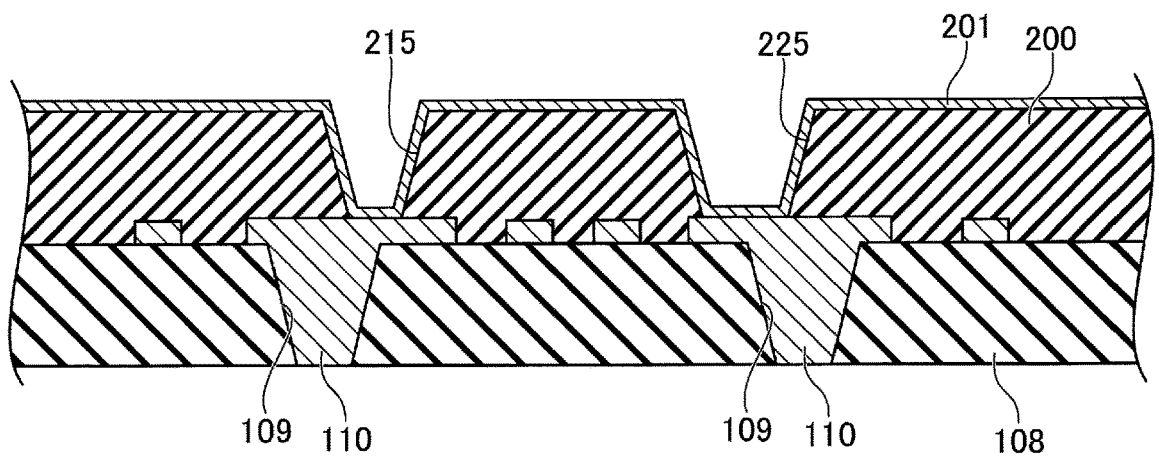

As illustrated in FIG. 7A, the first via-hole 215 and the second via-hole 225 are formed. Thereafter, a seed layer 201 is formed as illustrated in FIG. 7B. The seed layer 201, which may be formed by electroless copper plating, may have a thickness of 0.3 to 0.8 micrometers, for example.

Figure 7C:
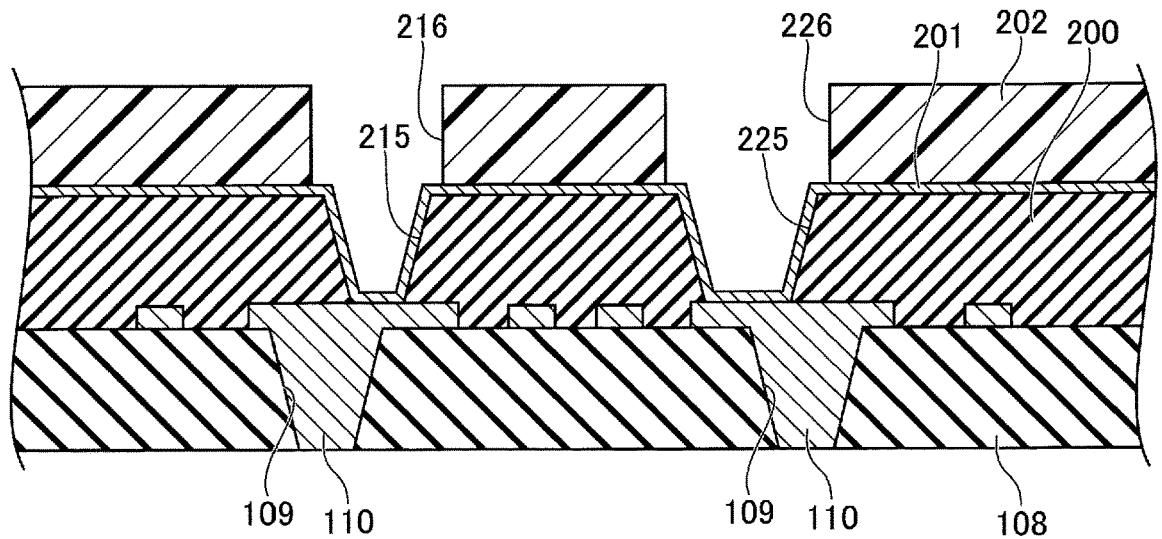

As illustrated in FIG. 7C, a resist layer 202 for plating is formed on the seed layer 201 such that the resist layer 202 has a first opening 216 at the position for the first connection terminal 210 and a second opening 226 at the position for the second connection terminal 220. The first opening 216 and the second opening 226 may be formed by photolithography. The thickness of the resist layer 202 may be 25 to 35 micrometers, for example. The diameter of the first opening 216 may be 40 to 45 micrometers, and the diameter of the second opening 226 may be 80 to 85 micrometers, for example.

Figure 8A:
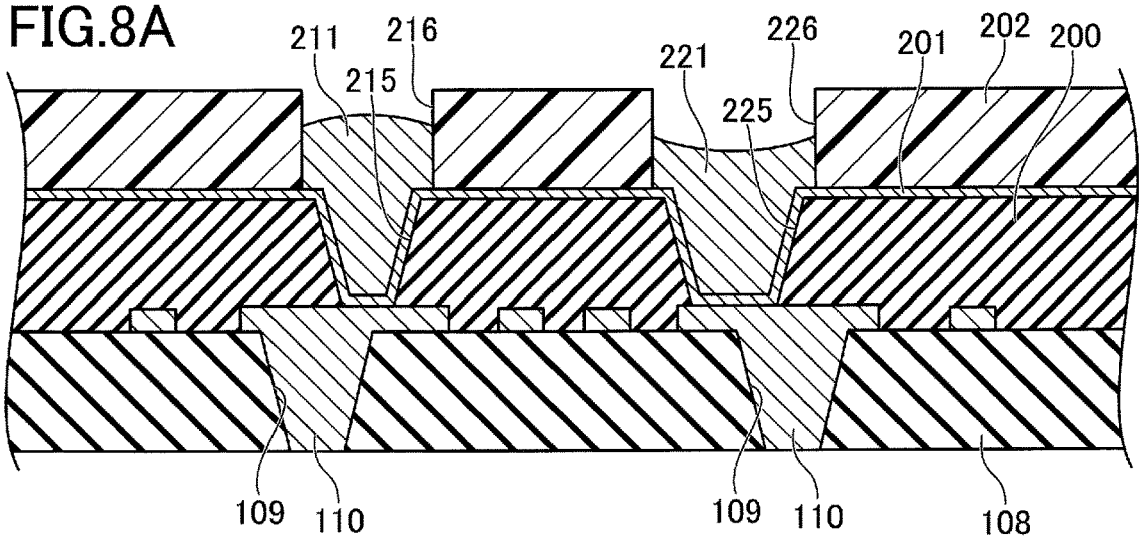
FIGS. 8A through 8C are cross-sectional views illustrating the method of forming connection terminals used in the first embodiment.

As illustrated in FIG. 8A, the first post 211 is formed inside the first via-hole 215 and the first opening 216, and the second post 221 is formed inside the second via-hole 225 and the second opening 226. The first post 211 and the second post 221 may be formed by electroplating that is performed by feeding power through the seed layer 201.

In the case of using electroplating to form a plating film, such as a copper plating film inside an opening, the surface of the plating film is concave at the incipient stage, and then gradually becomes flat, followed by becoming convex. Such changes in form depends on the diameter of the opening and the filling property of the plating solution. In the case where a plating solution having a low filling property is used, the length of time for the surface of the plating film to become flat or convex primarily depends on the diameter of the opening. The present embodiment utilizes such a property of a plating solution to stop the film formation in the state in which the surface of the second post 221 is concave and the surface of the first post 211 is convex. As a result, the first post 211 having a convex surface and the second post 221 having a concave surface are obtained as illustrated in FIG. 8A. It may be noted that the film formation may alternatively be stopped in the state in which the surface of the second post 221 is concave and the surface of the first post 211 is flat. The first post 211 and the second post 221 may be implemented as a multilayer structure comprised of a copper plating film and a nickel plating film, for example.

Figure 8B:
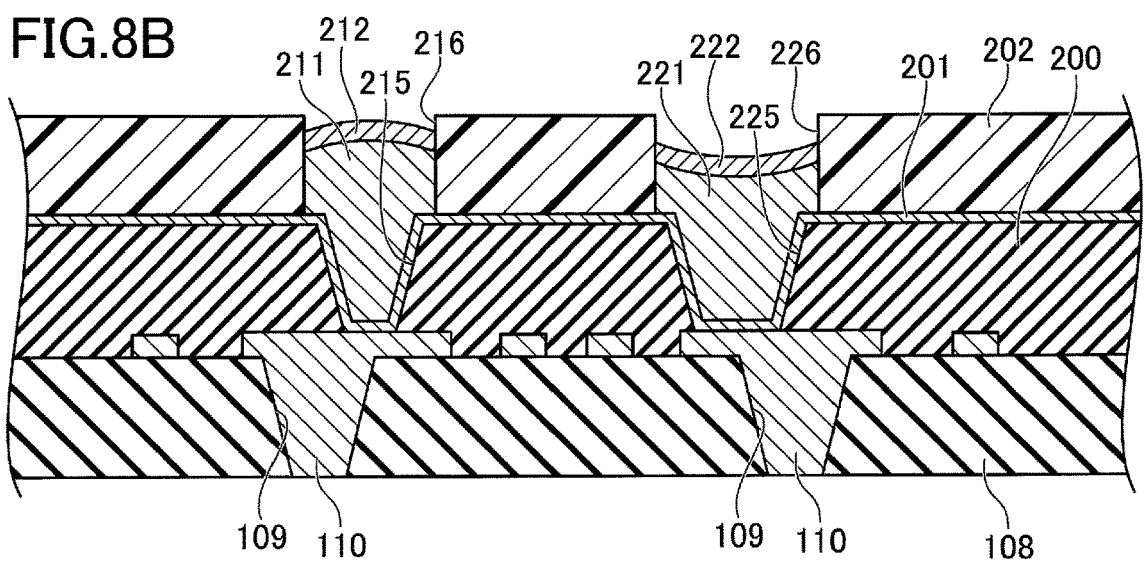

As illustrated in FIG. 8B, the first bump 212 is formed on the first post 211, and the second bump 222 is formed on the second post 221. The first bump 212 and the second bump 222 may be formed by electroplating. The first bump 212 and the second bump 222 are formed to conform to the shape of the surfaces of the first post 211 and the second post 221, respectively. The surface of the first bump 212 is convex or flat, and the surface of the second bump 222 is concave. The first bump 212 and the second bump 222 may be implemented as tin bumps made by electroplating that is performed by feeding power through the seed layer 201, for example.

Figure 8C:
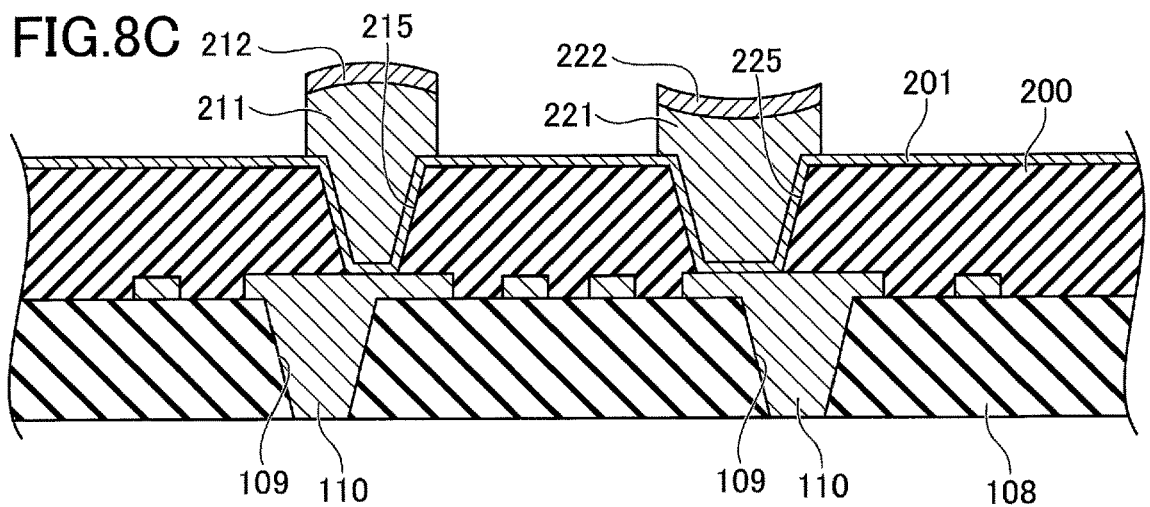

After this, as illustrated in FIG. 8C, the resist layer 202 is removed.

Figure 9A:
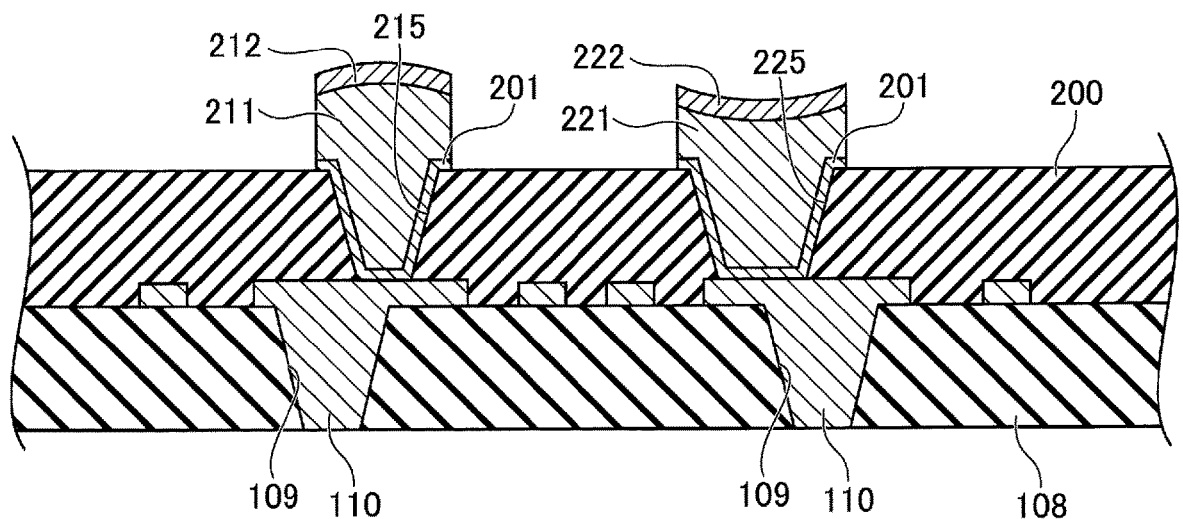
FIGS. 9A and 9B are cross-sectional views illustrating the method of forming connection terminals used in the first embodiment.

As illustrated in FIG. 9A, the first bump 212, the second bump 222, the first post 211, and the second post 221 are used as a mask to perform wet etching to remove the seed layer 201.

Figure 9B:
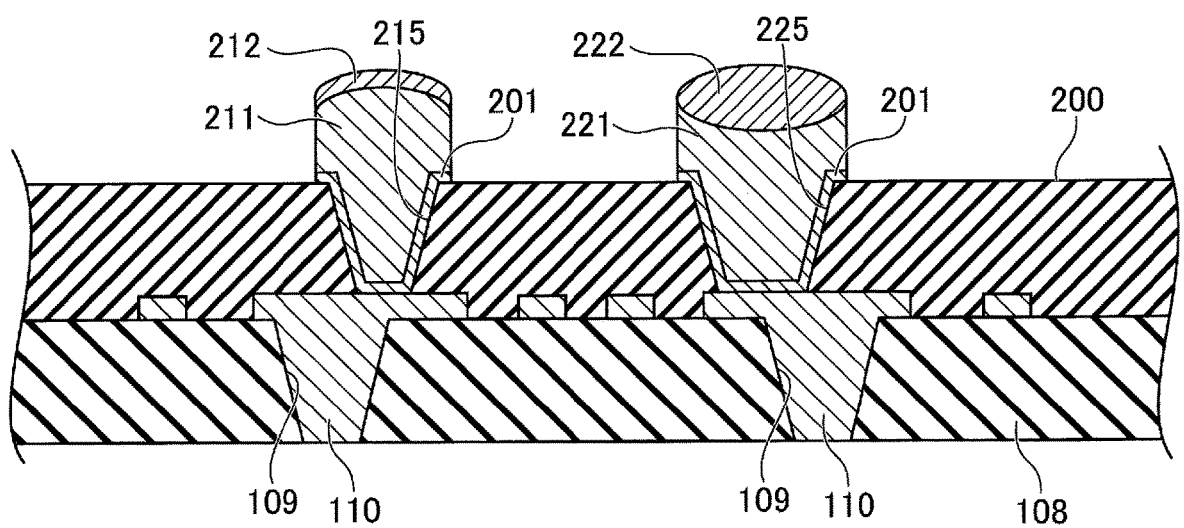

A reflow process is then performed at a temperature that is higher than or equal to the melting point of the first bump 212 and the second bump 222 and that is lower than the melting point of the first post 211 and the second post 221. As a result, the shape of the first bump 212 and the shape of the second bump 222 turn into energetically more stable shapes. In particular, the surface of the second bump 222 that was initially concave becomes convex as illustrated in FIG. 9B. In this manner, the first connection terminal 210 and the second connection terminal 220 are completed in final form. The height of the first connection terminal 210 and the height of the second connection terminal 220, as measured at the tops thereof, from the surface of the solder resist layer 200 are equal to each other, and may be 15 to 25 micrometers, for example.

The manufacturing method as described above serves to produce the interconnect substrate 100 in which the first connection terminals 210 and the second connection terminals 220 have an equal height at the peaks, without requiring a dedicated process step for making the first connection terminals 210 and the second connection terminals 220.

It may be noted that the seed layer 201 is omitted from illustration in FIG. 3 and FIG. 6B.

Second Embodiment

Figure 10:
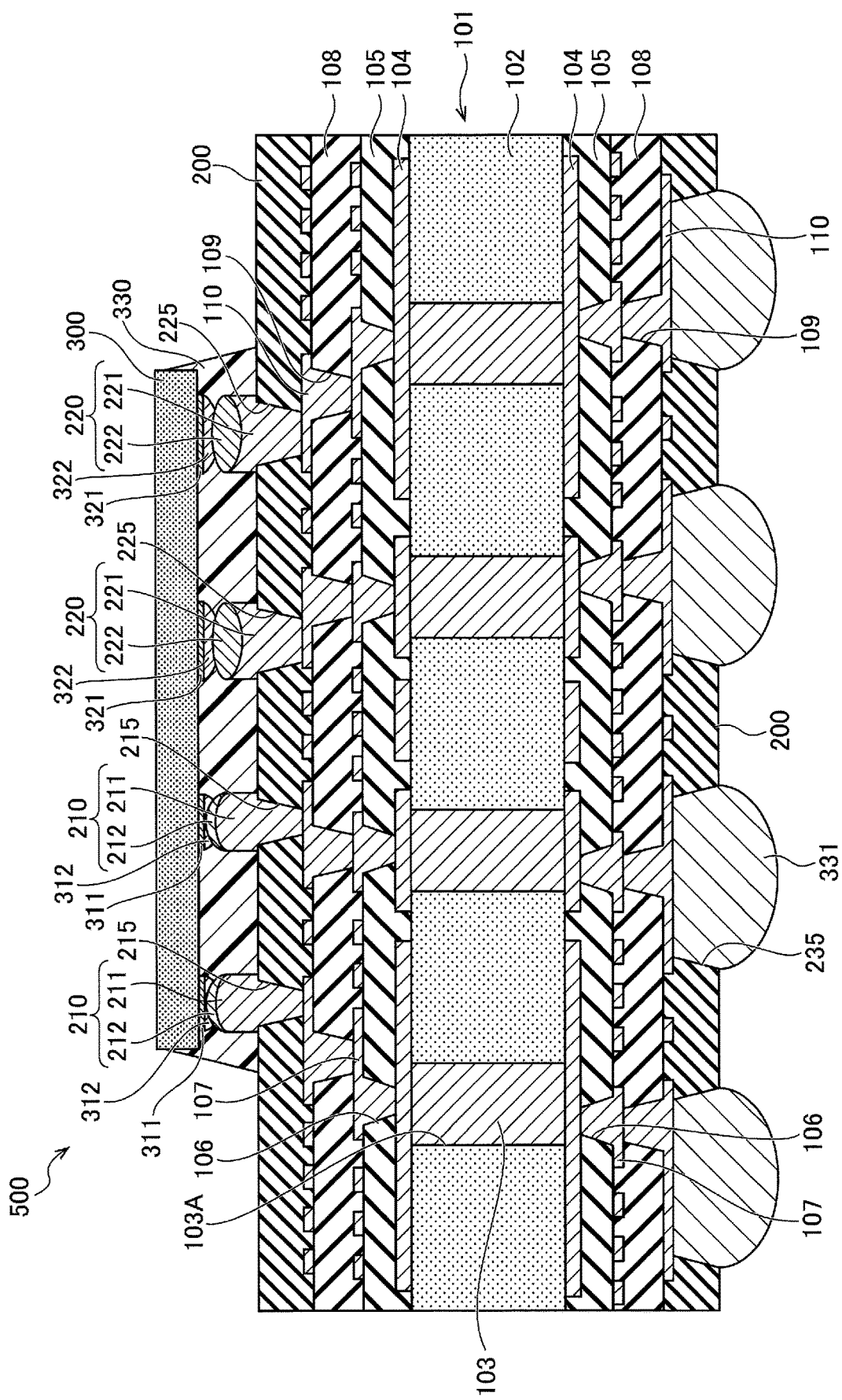
FIG. 10 is a cross-sectional view of a semiconductor package according to a second embodiment.

In the following, a second embodiment will be described. The second embodiment is directed to a semiconductor package. FIG. 10 is a cross-sectional view of a semiconductor package 500 according to the second embodiment.

As illustrated in FIG. 10, the semiconductor package 500 of the second embodiment includes the interconnect substrate 100 of the first embodiment, a semiconductor chip 300, third bumps 312, fourth bumps 322, an underfill resin 330, and external connection terminals 331.

The semiconductor chip 300 includes third connection terminals 311 coupled to the first connection terminals 210 through the third bumps 312, and includes fourth connection terminals 321 coupled to the second connection terminals 220 through the fourth bumps 322. The third connection terminals 311 and the fourth connection terminals 321 are electrode pads, for example. The diameter of the fourth connection terminals 321 is larger than the diameter of the third connection terminals 311. The third bumps 312 and the fourth bumps 322 may be implemented as solder balls, for example. Examples of the material of solder balls include a lead-free solder such as a tin-silver-based (Sn, Ag-based) alloy, a tin-zinc-based (Sn, Zn-based) alloy, or a tin-copper-based (Sn, Cu-based) alloy, or may be a leaded solder such as a lead-tin-based (Pb, Sn-based) alloy, similarly to the first bumps 212 and the second bumps 222. The underfill resin 330, made of an epoxy resin or the like, fills the gap between the semiconductor chip 300 and the solder resist layer 200 of the interconnect substrate 100.

The external connection terminals 331 are disposed on the lower third interconnect layer 110 at the surface of the interconnect substrate 100 opposite from the semiconductor chip 300. Similarly to the third bumps 312 and the fourth bumps 322, the external connection terminals 331 may be implemented as solder balls, for example.

In order to make the semiconductor package 500, the interconnect substrate 100 is provided as a separate piece, followed by mounting the semiconductor chip 300 in a flip-chip manner on the interconnect substrate 100 by use of the third bumps 312 and the fourth bumps 322. In so doing, the first connection terminals 210 and the third connection terminals 311 are satisfactorily connected, and the second connection terminals 220 and the fourth connection terminals 321 are satisfactorily connected, because the peak height of the first connection terminals 210 and the peak height of the second connection terminals 220 are substantially aligned. After the mounting of the semiconductor chip 300, the underfill resin 330 is used to fill the gap between the semiconductor chip 300 and the upper solder resist layer 200. Further, the external connection terminals 331 are formed on the lower third interconnect layer 110.

In this manner, the semiconductor package 500 is completed in final form.

According to at least one embodiment, the reliability of connections is improved.

Although a description has been given with respect to preferred embodiments and the like, the present invention is not limited to these embodiments and the like, but various variations and modifications may be made to these embodiments and the like without departing from the scope of the present invention. For example, although a core substrate is used in the above-described embodiments, the present disclosures are equally applicable to a coreless substrate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention have been described in detail, it should be understood that various changes, substitutions, and alterations could be made hereto without departing from the spirit and scope of the invention.

The present disclosure includes the subject matter as set out in the following clause.

A method of making an interconnect substrate, the method comprising:

forming a first columnar electrode and a second columnar electrode on a surface of a substrate by electroplating, the first columnar electrode having a flat or convex surface and having a first diameter, the second columnar electrode having a concave surface and having a second diameter larger than the first diameter;

forming a first bump on the first columnar electrode and a second bump on the second columnar electrode by electroplating, a melting point of the first bump and the second bump being lower than a melting point of the first columnar electrode and the second columnar electrode; and performing, after forming the first bump and the second bump, a reflow process at a temperature that is lower than the melting point of the first columnar electrode and the second columnar electrode, but higher than or equal to the melting point of the first bump and the second bump.

What is claimed is:

1. An interconnect substrate, comprising:
   a substrate; and
   a first connection terminal and a second connection terminal that are disposed on a surface of the substrate,
   wherein the first connection terminal includes a first columnar electrode and a first hump disposed on the first columnar electrode, the first columnar electrode having a convex surface and having a first diameter,
   wherein the second connection terminal includes a second columnar electrode and a second bump disposed on the second columnar electrode, the second columnar electrode having a concave surface and having a second diameter larger than the first diameter, and
   wherein a melting point of the first bump and the second bump is lower than a melting point of the first columnar electrode and the second columnar electrode,
   wherein, for the first columnar electrode and the second columnar electrode, a diameter and a surface shape are related to each other such that a larger diameter electrode has a concave surface, and a smaller diameter electrode has a convex surface, and
   wherein the first columnar electrode has an upper surface that is a curved convex surface, and the second columnar electrode has an upper surface that is a curved concave surface, and
   wherein a height of any point of the upper surface of the first columnar electrode as measured from the surface of the substrate is higher than a height of a highest point of the second columnar electrode as measured from the surface of the substrate.

2. The interconnect substrate as claimed in claim 1, wherein the first columnar electrode and the second columnar electrode contain copper, or nickel, or both thereof, and the first bump and the second bump contain tin or solder.

3. The interconnect substrate as claimed in claim 1, wherein the first bump has an upper surface that is a curved convex surface, and the second bump has an upper surface that is a curved convex surface.

4. The interconnect substrate as claimed in claim 1, wherein the substrate includes:
- a interconnect layer having a first connection part and a second connection part,
- a solder resist layer disposed on the interconnect layer, the solder resist layer having a first via-hole penetrating therethrough to expose the first connection part and a second via-hole penetrating therethrough to expose the second connection part,
- wherein the first connection terminal is disposed on the first connection part to extend through the first via-hole to protrude upwardly from the solder resist layer, and the second connection terminal is disposed on the second connection part to extend through the second via-hole to protrude upwardly from the solder resist layer.

5. The interconnect substrate as claimed in claim 4, wherein a diameter of the second via-hole is greater than a diameter of the first via-hole.

6. The interconnect substrate its claimed in claim 4, wherein the first columnar electrode has a first proximal part situated inside the first via-hole and a first distal part protruding upwardly from the solder resist layer, the first distal part leaving a greater diameter than the first proximal part, and
- wherein the second columnar electrode has a second proximal part situated inside the second via-hole and a second distal part protruding upwardly from, the solder resist layer, the second distal part having a greater diameter than the second proximal part.

7. The interconnect substrate as claimed in claim 4, wherein the first columnar electrode includes a copper plating film that fills the first via-hole and that protrudes upwardly from the solder resist layer, and
- wherein the second columnar electrode includes a copper plating film that fills the second via-hole and that protrudes upwardly from the solder resist layer.

8. The interconnect substrate as claimed in claim 4, wherein the first columnar electrode includes a first copper plating film that fills the first via-hole and that protrudes upwardly from the solder resist layer, and further includes a nickel plating film disposed on an upper surface of the first copper plating film, and
- wherein the second columnar electrode includes a second copper plating film that fills the second via-hole and that protrudes upwardly from the solder resist layer, and further includes, a nickel plating film disposed on an upper surface of the second copper plating film.

9. A semiconductor package, comprising
the interconnect substrate of claim 1; and
a semiconductor chip mounted on the interconnect substrate,
wherein the semiconductor chip has a third connection terminal coupled to the first connection terminal, and has a fourth connection terminal coupled to the second connection terminal.

\* \* \* \* \*